United States Patent
Asghar et al.

(10) Patent No.: US 7,600,179 B2
(45) Date of Patent: Oct. 6, 2009

(54) SPARSE MAXIMUM LIKELIHOOD DECODER FOR BLOCK CODES

(75) Inventors: Ziad Asghar, San Diego, CA (US); Gibong Jeong, San Diego, CA (US)

(73) Assignee: Texas Instruments Incorporated, Dallas, TX (US)

( * ) Notice: Subject to any disclaimer, the term of this patent is extended or adjusted under 35 U.S.C. 154(b) by 164 days.

(21) Appl. No.: 10/601,384

(22) Filed: Jun. 23, 2003

(65) Prior Publication Data

US 2004/0261004 A1    Dec. 23, 2004

(51) Int. Cl.
*H03M 13/03* (2006.01)
(52) U.S. Cl. .......................... 714/794; 375/341
(58) Field of Classification Search ............... 375/341; 714/794

See application file for complete search history.

(56) References Cited

U.S. PATENT DOCUMENTS

| | | |
|---|---|---|
| 5,103,451 A | 4/1992 | Fossey |
| 6,128,766 A | 10/2000 | Fahmi et al. |
| 6,183,323 B1 * | 2/2001 | Tanaka et al. ................. 440/77 |
| 6,961,387 B2 * | 11/2005 | Kim et al. .................... 375/262 |

FOREIGN PATENT DOCUMENTS

| KR | 1020040043582 A | 5/2004 |
|---|---|---|
| KR | 1020050110646 A | 11/2005 |

\* cited by examiner

*Primary Examiner*—Guy J Lamarre
*Assistant Examiner*—Sam Rizk
(74) *Attorney, Agent, or Firm*—Ronald O. Neerings; Wade James Brady, III; Frederick J. Telecky, Jr.

(57) ABSTRACT

A method is provided to decode data encoded by any block code in a manner that substantially improves the error correction capability of the block codes, and that is independent of the encoder. The structure associated with the method desirably allows the testing of those hypotheses that are known to exist, such that one can use the a priori knowledge of the possible set of hypotheses to only search from among them. The method of decoding data is both advantageous and desirable since knowing the subset of the code word space that is being utilized in essence allows the distance between the code words to be increased yielding significant decoding benefits.

1 Claim, 9 Drawing Sheets

SPARSE MAXIMUM LIKELIHOOD DECODER FOR BLOCK CODES

BACKGROUND OF THE INVENTION

1. Field of the Invention

This invention relates generally to wireless data communications, and more specifically to a method of substantially improving error correction capability of block codes in desired data communication applications.

2. Description of the Prior Art

In Third Generation Partnership Project (3 GPP), the transport format combination indicator (TFCI) is used for properly decoding the received data. The TFCI indicates one of the choices, namely, one of the transport format combinations regarding how to decode the channel bits. The Node-B (base station) informs the mobile station of the set of available transport format combinations. The TFCI determines coding type, CRC bits, transport block size, etc. Without the proper TFCI, the decoded data will most certainly fail CRC and the transmission will be counted as a block error. The TFCI field is encoded by using a Reed Muller code to protect it.

FIG. 1 shows the frame structure 10 for a downlink dedicated physical channel (DPCH). Depending on the slot format, there may be anywhere from 0 to 8 TFCI bits per slot in normal mode, or 0 to 16 bits per slot in compressed mode. This results in 0 to 120 bits for TFCI in a frame. Whenever the number of TFCI bits after encoding exceed or are less than the number of available TFCI bits in a frame, the TFCI bits are punctured or repeated, respectively. In the case of normal or logical split TFCI mode, the TFCI is encoded using a (32,10) Reed Muller code. The encoding procedure 20 is shown below in FIG. 2. In case of split TFCI using hard split, the TFCI for the DPCH and Downlink Shared Channel (DSCH) channels are encoded separately using a (16,5) bi-orthogonal code. FIG. 2 shows the encoder block diagram for the Normal mode.

The reception of the TFCI is critical to proper operation of the user equipment (UE). Whenever the TFC is received with an error, data for the corresponding transmission time interval (TTI) are most likely to be discarded. For 80 ms TTI, that is the data that has been received over the last 8 frames and translates into large chunks of data being lost. One current universal mobile telecom system (UMTS) chipset uses the Green Machine disclosed by F. J. MacWilliams and N. J. A. Sloane, *The theory of Error-Correcting Codes*, North-Holland, Amsterdam, 1977, to decode the encoded data transmitted by the UTRAN. In this report, a technique is proposed to improve the performance of the TFC decoder using an alternate approach. Although this technique is used to decode Reed Muller encoded data, it can be easily extended to other codes whenever all the code words of a code are not used.

The Green Machine decoder is used to decode Reed-Muller (RM) encoded data as stated herein before. The green machine is an approach to decode RM codes using Walsh Hadamard Transforms. In this approach, the decoder searches for the decoded data among all the code words even if a large subset of these code words is not used. In addition, the basis vectors for the RM code need to be saved in memory along with intermediate summation results to decode the data properly. The block diagram of the green machine decoder structure 30 is shown in FIG. 3.

Another approach used in the prior art is the generator matrix approach that uses a hard decision approach to carry out syndrome testing such as disclosed by Proakis, John G., *Digital communications*, McGraw-Hill, Inc., 1995.

In U.S. Pat. No. 6,341,125, entitled *Method for improving TFCI transportation performance*, by Hong, Sung Kwon, et al., issued Jan. 22, 2002, an attempt is made to improve the encoder to transmit TFCI with a low BER. In any of the above, no attempt is made to improve the decoder's performance or to provide more protection to the transmitted bits.

In view of the foregoing, it would be both advantageous and desirable in the wireless data communication art to provide a method that is independent of the encoder and that can be used to decode data encoded by any block code in a manner that substantially improves the error correction capability of the block codes. It would be further advantageous and desirable if the structure associated with the method could allow the testing of those hypotheses that are known to exist, such that one can use the a priori knowledge of the possible set of hypotheses to only search from among them. Such a method would also be advantageous and desirable since knowing the subset of the code word space that is being utilized in essence allows the distance between the code words to be increased yielding significant decoding benefits.

SUMMARY OF THE INVENTION

The present invention is directed to a method that can be used to decode data encoded by any block code in a manner that substantially improves the error correction capability of the block codes, and that is independent of the encoder. UE is informed of the TFCS by higher layer signaling. Embodiments of the invention are described in the Universal Mobile Telephone System (UMTS) without restricting the invention to such. A UMTS terrestrial radio access network (UTRAN) informs the UE of all possible TFCIs by an "information element" (IE) called "Transport Format Combination Set". This is listed in 10.3.5.20 of TS25.331 of the 3 GPP specification. The structure associated with the method desirably allows the testing of those hypotheses that are known to exist, such that one can use the a priori knowledge of the possible set of hypotheses to only search from among them. The method of decoding data is advantageous and desirable since knowing the subset of the code word space that is being utilized in essence allows the distance between the code words to be increased yielding significant decoding benefits.

According to one embodiment, a method of decoding a block code comprises the steps of:

providing a Maximum Likelihood (ML) sparse decoder; and decoding solely the a priori information of the code space subset used.

According to another embodiment, a maximum likelihood (ML) sparse decoder for block codes comprises:

a hypothesis generator operational to iterate over all possible values of a predetermined transport format combination indicator (TFCI).;

a code word generator operational to generate a corresponding encoded TFCI for the hypothesis that is being decoded in a desired iteration;

a correlator operational to correlate the corresponding encoded TFCI to the soft output of an associated rake receiver; and a maximum finder operational to compare the correlation result for the current iteration with that of the immediately previous iteration to determine the most correlated hypothesis.

According to yet another embodiment, a maximum likelihood (ML) sparse decoder for block codes comprises:

means for iterating over all possible values of a transport format combination indicator (TFCI);

means for generating a corresponding encoded TFCI for a hypothesis that is being decoded in a desired iteration;

means for correlating the corresponding encoded TFCI to the soft output of an associated rake receiver; and means for comparing the correlation result for the current iteration with that of the immediately previous iteration to determine the most correlated hypothesis.

BRIEF DESCRIPTION OF THE DRAWINGS

Other aspects and features of the present invention and many of the attendant advantages of the present invention will be readily appreciated as the aspects and features become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation.

Numerous other modifications and embodiments can be devised by those skilled in the art which fall within the scope and spirit of the principles of this invention.

DETAILED DESCRIPTION OF THE PREFERRED EMBODIMENTS

The techniques described herein below substantially improve the sparse decoder error free detection probability, as stated herein before. The encoder is not modified in any way, although the decoder's ability to decode is improved significantly. The present inventors exploited the fact that most of the time the code word space is not fully utilized in some applications. Based on the 10-bit TFCI, there can be 1024 possible TFCIs; but this large number is never used, and in fact usually it is much less than that number. A maximum likelihood decoding approach was employed for the code words that are known to be used. This can be done for a user equipment (UE) in normal use, because in most cases the TFCS (Transport Format Combination Set) size is significantly smaller than the maximum TFCS size supported. The Node-B signals the TFCS size to the UE. Since the TFCS size is known, the approach described herein below allows its use to improve the decoder's performance.

Sparse Decoder Implementation for the (32, 10) Bi-Orthogonal Code

Figure 1:
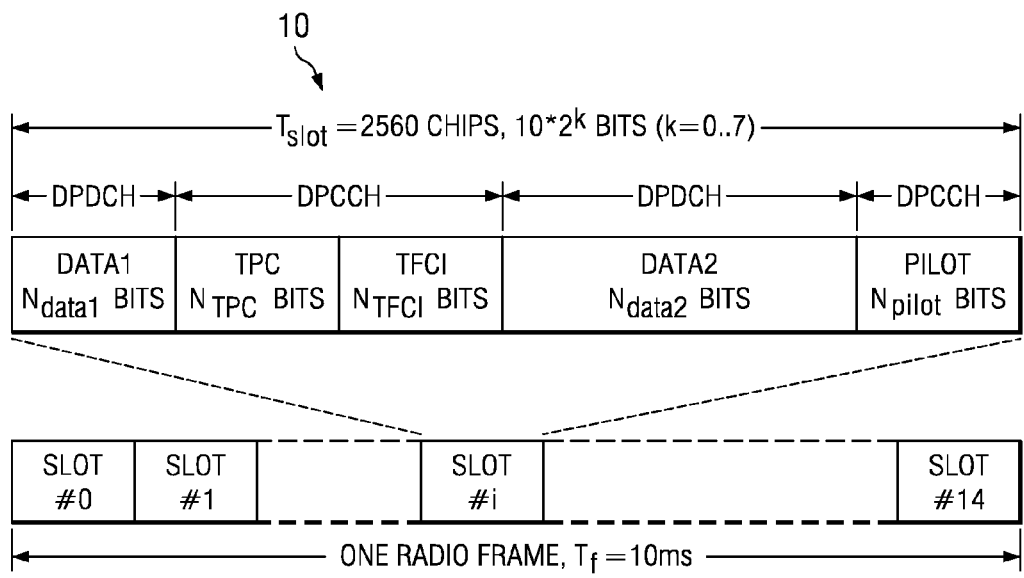
FIG. 1 depicts a frame structure for downlink DPCH.
Figure 2:
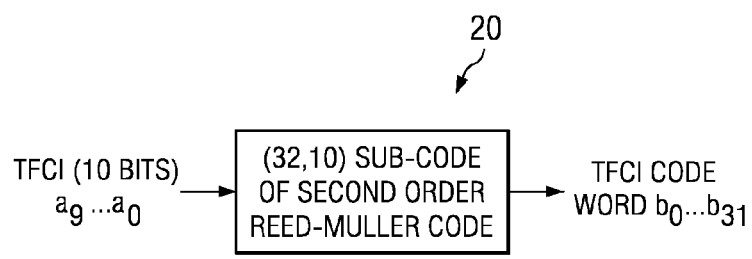
FIG. 2 is a block diagram illustrating a TFCI encoding procedure.
Figure 3:
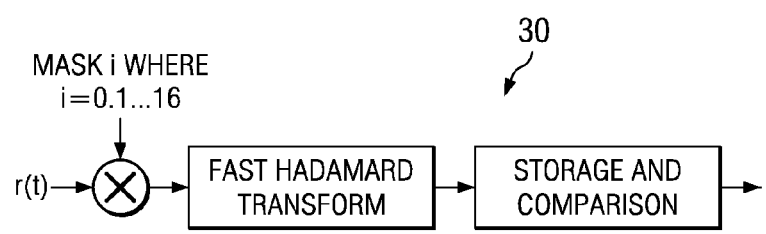
FIG. 3 illustrates a Green Machine decoder structure.
Figure 4A:
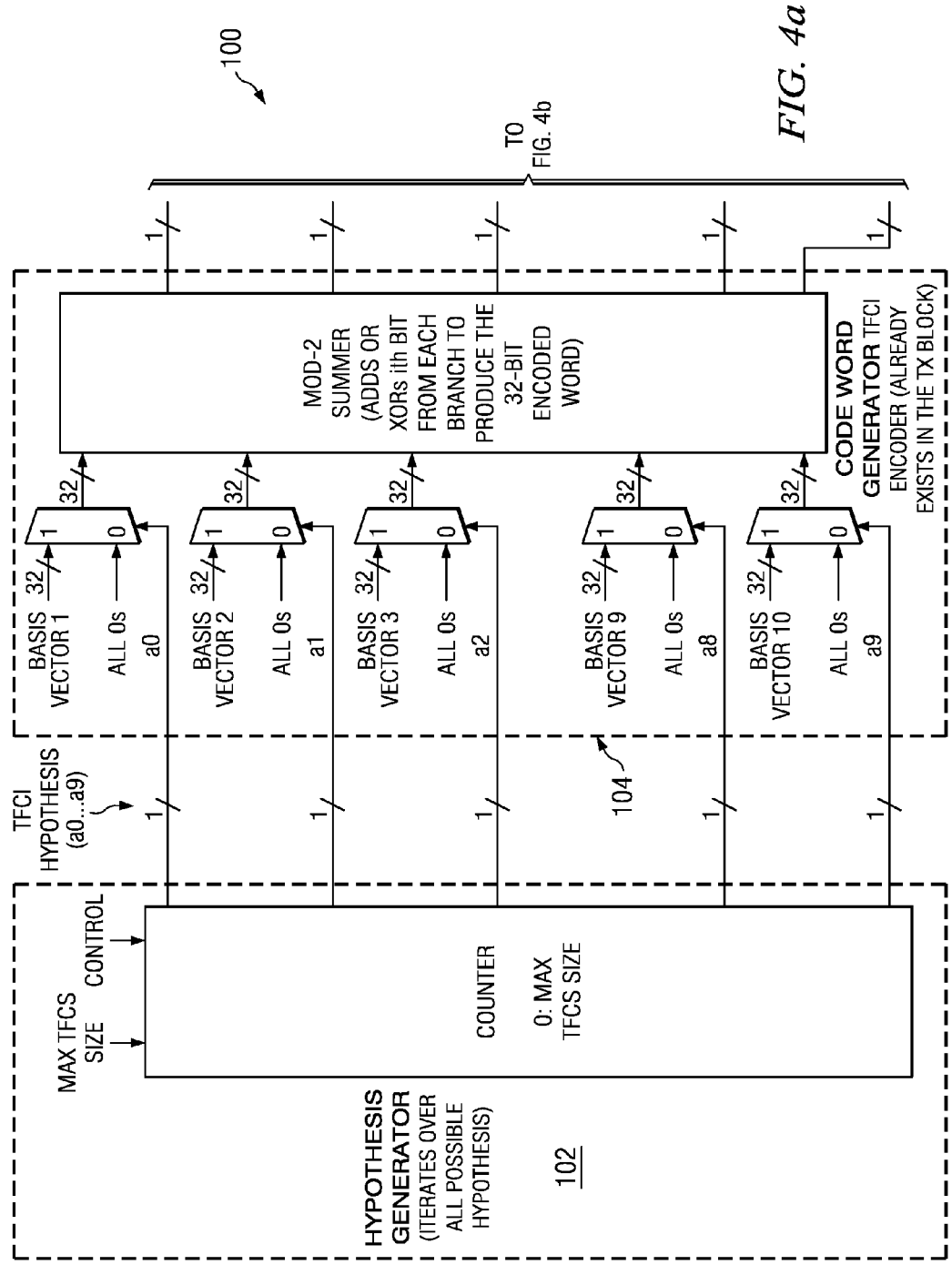
FIGS. 4a and 4b depict a diagram illustrating a sparse decoder implementation for the (32, 10) Reed Muller Code.
Figure 4B:
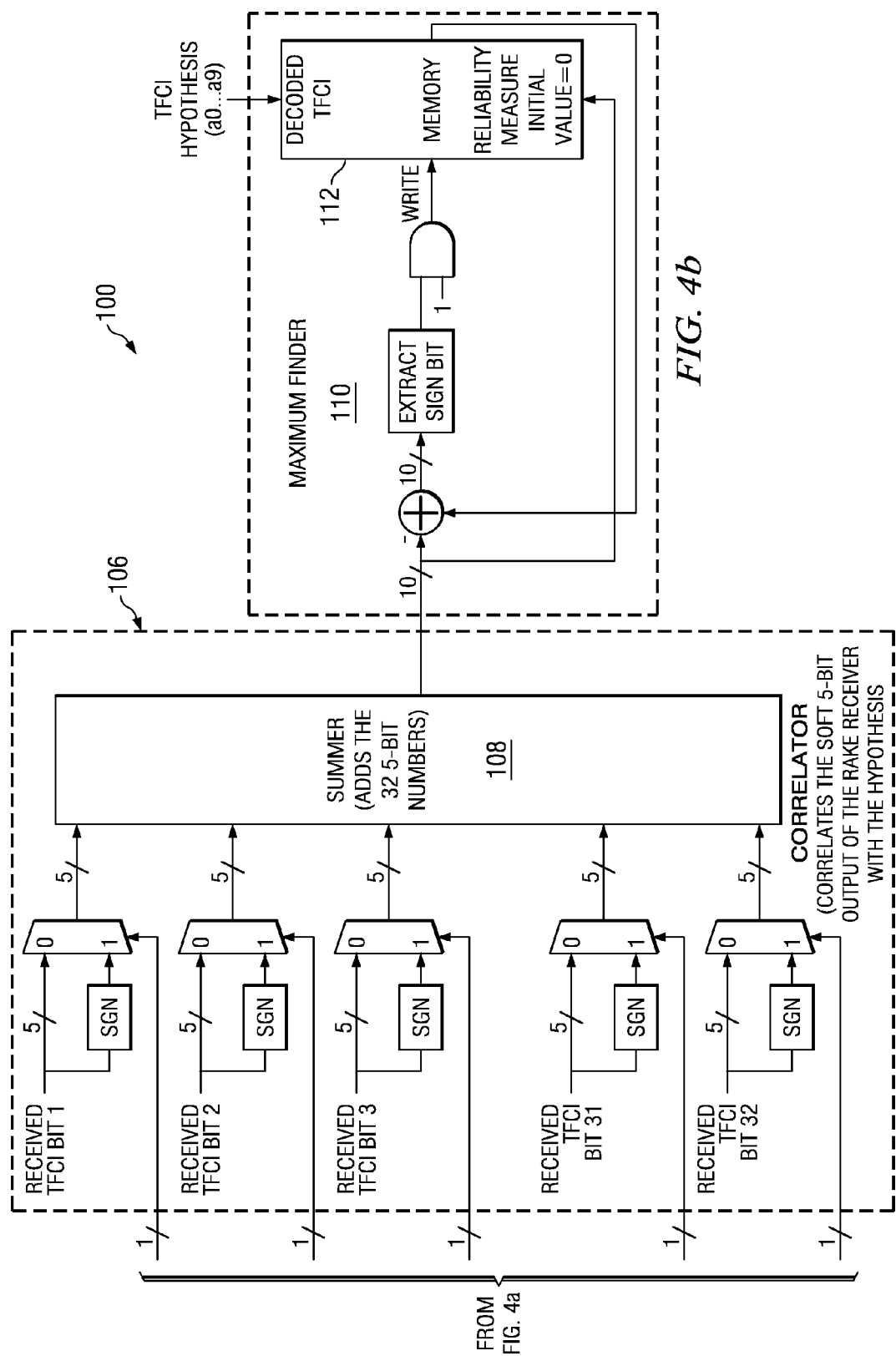
Figure 5A:
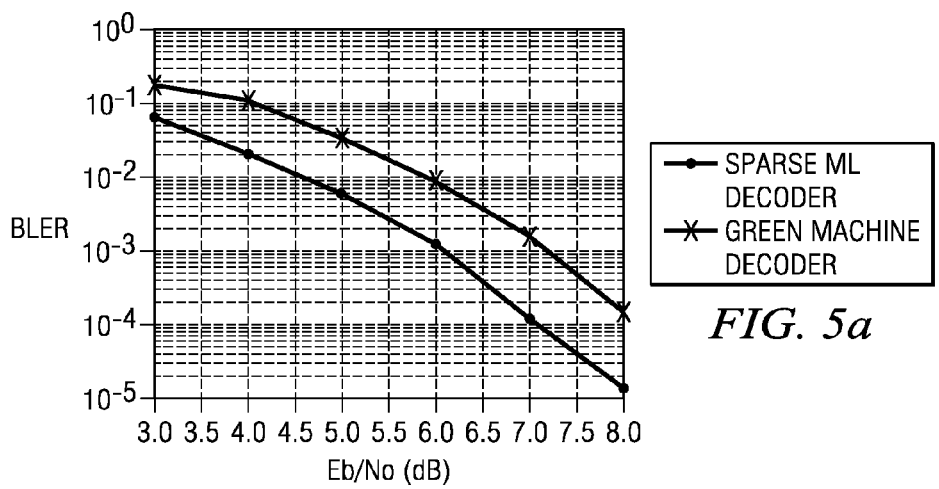
FIGS. 5a-5e show plots illustrating performance comparisons between a Green Machine Decoder and a decoder implemented in accordance with particular embodiments of the present invention for a TFCS size=128, 64, 32, 16 and 8 respectively for slot format 13, 14 and 15.
Figure 5B:
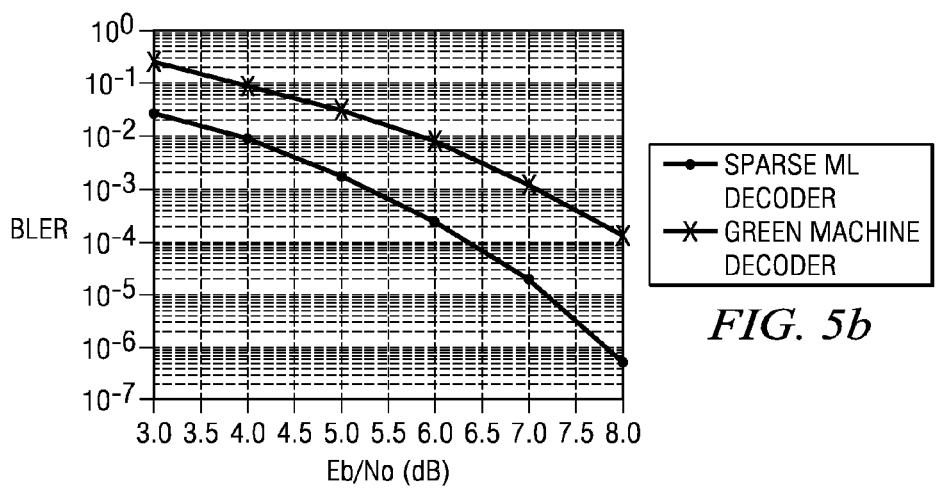
Figure 5C:
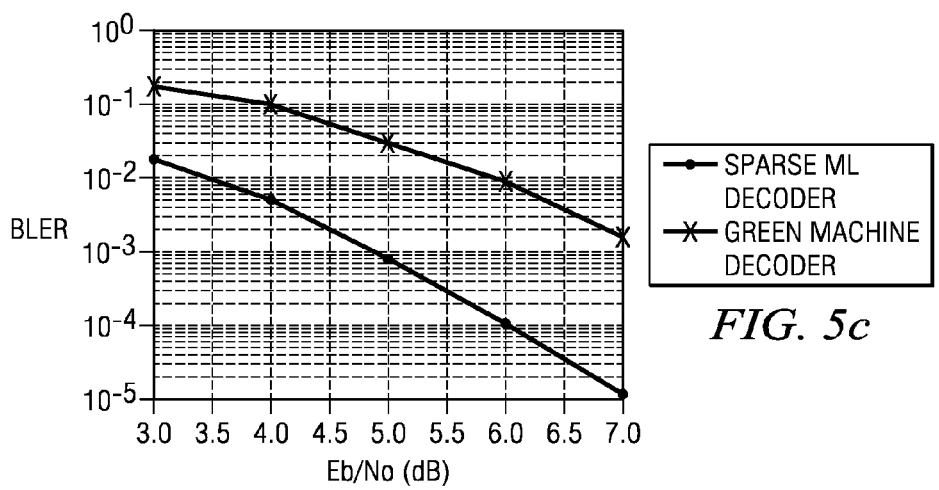
Figure 5D:
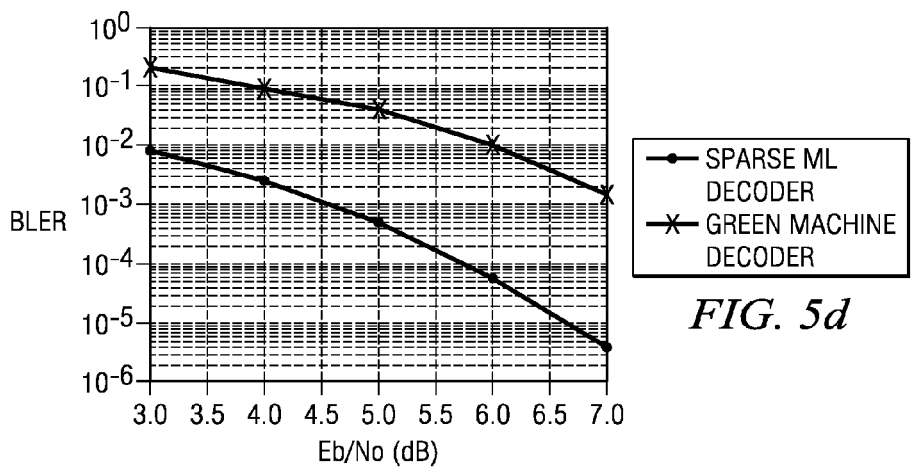
Figure 5E:
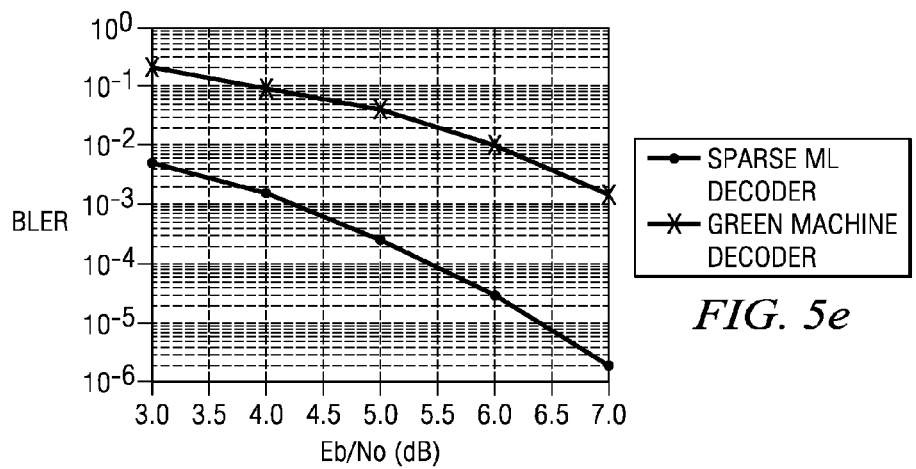
Figure 5F:
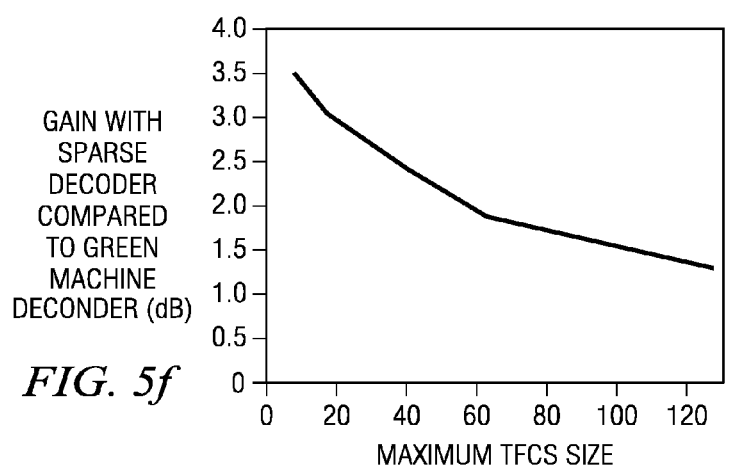
FIG. 5f is a graph illustrating gain comparisons between a Green Machine Decoder and a decoder due to use of a sparse decoder implemented in accordance with particular embodiments of the present invention for various TFCS sizes.

Looking now at FIGS. 4a and 4b a diagram illustrates a sparse decoder 100 implementation for the (32, 10) Reed Muller Code in accordance with one embodiment of the present invention. Given the TFCS size, the "Hypothesis Generator" 102 iterates over all the possible values of the TFCI. Usually this number will be pretty small and that is where this decoder 100 structure will yield the most benefit in terms of performance improvement and power savings described in more detail herein below. The case where the size of the TFCS is equal to 1024 (maximum possible) is only in the case of a logically split TFCI. This is the case when a DPCH channel in addition to a DSCH channel is used and the TFCI of both the channels is transmitted over the downlink DPCCH. In this scenario, the 5-bit TFCI of the DPCH is concatenated with the 5-bit TFCI of the DSCH channel and then the 10-bits are encoded using the (32,10) Reed Muller code.

The "Code Word Generator" 104 block generates the corresponding encoded 32-bit TFCI for the hypothesis that is being tested in the given iteration. It is interesting to note that this block is the encoder section that may already exist in the transmitter hardware, and can be reused easily because the user equipment uses the same code to transmit the TFCI back to the Node B. The basis vectors are given below in Table 1 below.

TABLE 1

Basis sequences for (32,10) TFCI code

| I | $M_{I,0}$ | $M_{I,1}$ | $M_{I,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 0 | 1 | 0 | 0 | 0 | 0 | 1 | 0 | 0 | 0 | 0 |
| 1 | 0 | 1 | 0 | 0 | 0 | 1 | 1 | d | 0 | 0 |
| 2 | 1 | 1 | 0 | 0 | 0 | 1 | 0 | 0 | 0 | 1 |
| 3 | 0 | 0 | 1 | 0 | 0 | 1 | 1 | 0 | 1 | 1 |
| 4 | 1 | 0 | 1 | 0 | 0 | 1 | 0 | 0 | 0 | 1 |
| 5 | 0 | 1 | 1 | 0 | 0 | 1 | 0 | 0 | 1 | 0 |
| 6 | 1 | 1 | 1 | 0 | 0 | 1 | 0 | 1 | 0 | 0 |
| 7 | 0 | 0 | 0 | 1 | 0 | 1 | 0 | 1 | 1 | 0 |
| 8 | 1 | 0 | 0 | 1 | 0 | 1 | 1 | 1 | 1 | 0 |

TABLE 1-continued

Basis sequences for (32,10) TFCI code

| I | $M_{I,0}$ | $M_{I,1}$ | $M_{I,2}$ | $M_{i,3}$ | $M_{i,4}$ | $M_{i,5}$ | $M_{i,6}$ | $M_{i,7}$ | $M_{i,8}$ | $M_{i,9}$ |
|---|---|---|---|---|---|---|---|---|---|---|
| 9  | 0 | 1 | 1 | 0 | 1 | 0 | 1 | 1 | 0 | 1 |
| 10 | 1 | 1 | 0 | 1 | 0 | 1 | 0 | 0 | 1 | 1 |
| 11 | 0 | 0 | 1 | 1 | 0 | 1 | 0 | 1 | 1 | 0 |
| 12 | 1 | 0 | 1 | 1 | 0 | 1 | 0 | 1 | 0 | 1 |
| 13 | 0 | 1 | 1 | 1 | 0 | 1 | 1 | 0 | 0 | 1 |
| 14 | 1 | 1 | 1 | 1 | 0 | 1 | 1 | 1 | 1 | 1 |
| 15 | 1 | 0 | 0 | 0 | 1 | 1 | 1 | 1 | 0 | 0 |
| 16 | 0 | 1 | 0 | 0 | 1 | 1 | 1 | 1 | 0 | 1 |
| 17 | 1 | 1 | 0 | 0 | 1 | 1 | 1 | 0 | 1 | 0 |
| 18 | 0 | 0 | 1 | 0 | 1 | 1 | 0 | 1 | 1 | 1 |
| 19 | 1 | 0 | 1 | 0 | 1 | 1 | 0 | 1 | 0 | 1 |
| 20 | 0 | 1 | 1 | 0 | 1 | 1 | 0 | 0 | 1 | 1 |
| 21 | 1 | 1 | 1 | 0 | 1 | 1 | 0 | 1 | 1 | 1 |
| 22 | 0 | 0 | 0 | 1 | 1 | 1 | 0 | 1 | 0 | 0 |
| 23 | 1 | 0 | 0 | 1 | 1 | 1 | 1 | 1 | 0 | 1 |
| 24 | 0 | 1 | 0 | 1 | 1 | 1 | 1 | 0 | 1 | 0 |
| 25 | 1 | 1 | 0 | 1 | 1 | 1 | 1 | 0 | 0 | 1 |
| 26 | 0 | 0 | 1 | 1 | 1 | 1 | 0 | 0 | 1 | 0 |
| 27 | 1 | 0 | 1 | 1 | 1 | 1 | 1 | 1 | 0 | 0 |
| 28 | 0 | 1 | 1 | 1 | 1 | 1 | 1 | 1 | 1 | 0 |
| 29 | 1 | 1 | 1 | 1 | 1 | 1 | 1 | 1 | 1 | 1 |
| 30 | 0 | 0 | 0 | 0 | 0 | 1 | 0 | 0 | 0 | 0 |
| 31 | 0 | 0 | 0 | 0 | 1 | 1 | 1 | 0 | 0 | 0 |

The "Correlator" 106 block takes the generated hypothesis and correlates it to the 5-bit soft output of the rake receiver. Since the output of the "Code Word Generator" 104 is just zeros and ones, the correlator bank can be implemented as multiplexers where the encoded bit acts as the control signal. The results of the 32 correlations are then added in the summer 108. A sign inverter and a multiplexer are equivalent to a multiplier by +1 or −1; and the correlation is the sum of those products. This correlation is a measure of the confidence in the decoded result. The utility of this reliability measure is discussed further herein below.

The "Maximum Finder" 110 simply compares the correlation result for the current iteration with that of the previous iteration. In the case of the first iteration the correlation result is compared with 0. The circuit 110 can be seen to extract the sign bit of the result of the comparison. If it is logic '1' then that means that the particular hypothesis that is being tested is most correlated with the received TFCI bits coming out of the rake receiver. Hence, the hypothesis that is being tested and the correlation result are written to the memory 112. For the next hypothesis, this stored result is used for comparison and so on.

Sparse Decoder Implementation for the (16,5) Bi-Orthogonal Code

The present inventors recognized the structure shown in FIGS. 4a and 4b can be made flexible enough to readily support the (16,5) Reed Muller code in addition to the (32,10) code. The basis vectors for the (16,5) code will be used in such a scenario and the decoder will be run twice to decode both the TFCIs, one for the DPCH channel and the other for the DSCH channel. The basis vectors for this code are shown in Table 2 below.

TABLE 2

Basis sequences for (16,5) TFCI code.

| i | $M_{i,0}$ | $M_{i,1}$ | $M_{i,2}$ | $M_{i,3}$ | $M_{i,4}$ |
|---|---|---|---|---|---|
| 0  | 1 | 0 | 0 | 0 | 1 |
| 1  | 0 | 1 | 0 | 0 | 1 |
| 2  | 1 | 1 | 0 | 0 | 1 |
| 3  | 0 | 0 | 1 | 0 | 1 |
| 4  | 1 | 0 | 1 | 0 | 1 |
| 5  | 0 | 1 | 1 | 0 | 1 |
| 6  | 1 | 1 | 1 | 0 | 1 |
| 7  | 0 | 0 | 0 | 1 | 1 |
| 8  | 1 | 0 | 0 | 1 | 1 |
| 9  | 0 | 1 | 0 | 1 | 1 |
| 10 | 1 | 1 | 0 | 1 | 1 |
| 11 | 0 | 0 | 1 | 1 | 1 |
| 12 | 1 | 0 | 1 | 1 | 1 |
| 13 | 0 | 1 | 1 | 1 | 1 |
| 14 | 1 | 1 | 1 | 1 | 1 |
| 15 | 0 | 0 | 0 | 0 | 1 |

Logical Split Mode Handling

In this mode, the TFCIs for the DPCH and DSCH are concatenated prior to being encoded using the (32,10) Reed Muller code. If both the DPCH and DSCH TFCI channels are using the maximum size, then that forms the most likely scenario where there might be a need to run the sparse decoder 100 through all the 1024 hypotheses. In the case where the DPCH channel and DSCH channel don't use the maximum possible TFCS size, then based on the 5-bits allocated for the TFCI in this mode, one can still use the TFCS information for both DPCH and DSCH. In this case, one uses the $TFCSsize_{DPCH}$ and $TFCSsize_{DSCH}$, converts them to binary numbers and concatenates the two 5-bit binary numbers to form a 10-bit TFCI number, and then changes it to a decimal. The "Max TFCS size" in the Hypothesis Generator 102 can be set to this number to decode the concatenated TFCIs. One such procedure is detailed below as follows:

binary($TFCSsize_{DPCH}$)=[$a_0$ $a_1$ $a_2$ $a_3$ $a_4$]

binary($TFCSsize_{DSCH}$)=[$b_0$ $b_1$ $b_2$ $b_3$ $b_4$]

Set "Max TFCS size"=decimal($a_0$ $a_1$ $a_2$ $a_3$ $a_4$ $b_0$ $b_1$ $b_2$ $b_3$ $b_4$)

The present invention is not so limited however; and alternatively, the Hypothesis Generator 102 may store all the possible codes instead of storing Max TFCS size.

The present inventors found that whenever the TFCS size is smaller than the maximum size, the performance of the sparse decoder 100 is better than that of other decoders. In the case when the maximum possible TFCS size (for which there is no known scenario except logical split mode) is used, the performance was found to be just as good as the Green Machine or any other decoder. If the TFCS signaled to the UE by the UTRAN is equal to 128, then the idea is to correlate the code words that relate to 1-128 TFCIs with the received TFCI code word; and the correlation that yields the largest value is the one that is the decoded TFCI. The maximum likelihood decoder is optimum. The net affect of limiting the code space used is that the resulting distance between the code words used increases thus yielding better decoding capability.

FIGS. 5a-5e show plots illustrating performance comparisons between a Green Machine Decoder and a decoder implemented in accordance with particular embodiments of the present invention described herein before. Results are shown for various cases where the maximum TFCS size is limited to less than the maximum size. With the TFCS size at 8 there is a 3.5 dB improvement over the performance of the Green Decoder. In the case of larger TFCS sizes such as 128 and 64, the improvement is 1.4 dB and 1.85 dB respectively. In the case of PCH (paging channel), the TFCI size can be even smaller yielding even higher gains. These are very significant improvements.

A UE using the sparse decoder 100 will have significantly better reception than one that is not using it. It can be appreciated this design will then translate into better reception or voice quality, fewer dropped calls and lower probabilities of missed pages than other approaches known in the art. FIG. 5 (*f*) shows the gain due to the sparse decoder 100 for various TFCS sizes over the Green Machine decoder. The performance gain in dB means the reduction in base station transmit power for the same quality. This power reduction translates to network capacity increase in the CDMA system(s).

Those skilled in the art will recognized that a linear bock code can be viewed as a n-tuple vector space. A code can be seen as a point in this space where the hamming distance (measure of the difference between code words; and it is equal to the number of corresponding elements or positions in which two code words differ) from the closest neighbor translates into the error correcting capability of the code. When the code is limited such that not all the code words are allowed, then in essence one increases the hamming distance of the code and hence its error correcting ability. This can be viewed as making the vector space sparse.

It is known that for a linear block code, the minimum distance is given by:

$d_{min} = \min_{r, r \neq 1}\{w_r\}$, where $w_r$ denotes the weight of the r-th code word.

If we look at the minimum Hamming distance of the (32, 10) Reed Muller code, shown in Table 3 below, we notice that the minimum weight apart from the all 0 code word is 12. Then from the above equation, the minimum distance of the code is 12. As we limit the number of code words allowed, two factors come into play that improve the decoder 100 performance:

1) The minimum hamming distance of the resultant code increases; and
2) The hamming distance between individual code words increases. This is evident from FIG. 5.

TABLE 3

Minimum hamming weight of the code as the TFCS size is restricted.

| Maximum TFC | Minimum Hamming Distance |
|---|---|
| 16 | 16 |
| 32 | 16 |
| 64 | 16 |
| 128 | 12 |
| 1024 | 12 |

Figure 6:
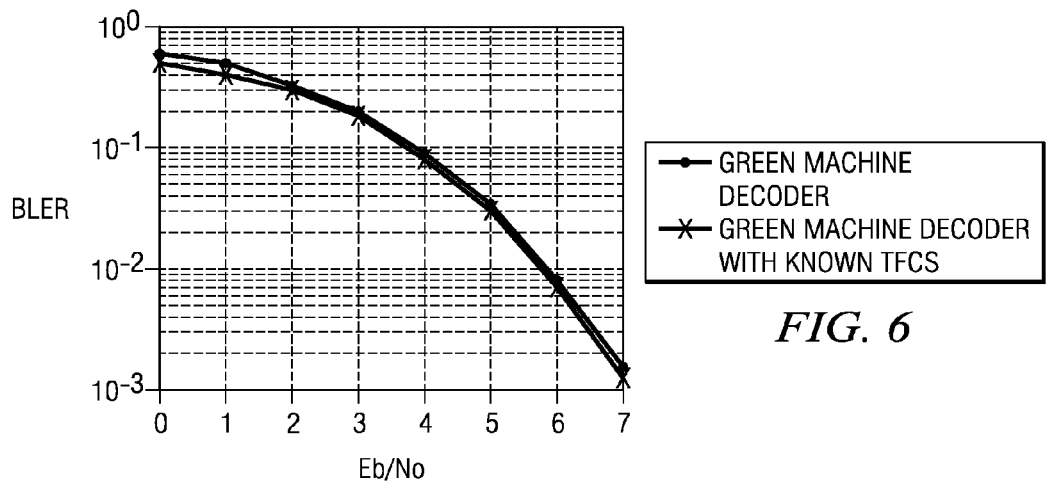
FIG. 6 is a graph depicting plots showing the performance of the Green Machine Decoder with a known TFCS size=8 for slot format 13, 14 and 15.

The present inventors also studied the possibility of using the TFCS size information for the Green Machine decoder. The plot shown in FIG. 6 is for the case where the TFCS size is 8. After decoding by Green Machine, 7 bits are ignored since they are known to be zero because we need only 3 bits to represent the TFCS size of 8. There is a minute improvement; but unlike the sparse decoder 100, the Green Machine decoder cannot improve the performance by any significant margin. In the best case at low Eb/No, the improvement is about 0.5 dB compared with 3.5 dB in the case of the sparse decoder 100. The improvement applies for the case where only the ignored bits are in error and none of the other bits are received with any error.

Reliability Measure to Improve TFCI Decoding for Longer TTIs

As the decoder 100 runs through all the hypotheses, starting from TFCI=0 to the max TFCI, the results of the correlation are compared with the results of the previous hypothesis. Each time the new correlation results exceed the previous highest result, the corresponding TFCI is saved along with the correlation result. The correlation result is an indicator of the confidence in the decoded TFCI. This can be very useful in the case where a block is being decoded that is more than the minimum TTI (Transmission Time Interval) size. In this case, the TFCI is received every frame or every 10 msec. In UMTS, there can be a 10,20,40 or 80 ms TTI. In the case of 80 ms TTI, 8 different TFCIs are decoded over the 80 ms before the data is decoded. If the received TFCIs are different due to errors there is no way of determining which one to use. In such a case, the reliability measure associated with each decoded TFCI could be used to improve the final decoded TFCI used to decode the actual block of data. This would further improve the BLER for longer TTIs where there is the probability of the loss of a large block of data. At the end of the longest TTI of data, we get 2 arrays, one corresponding to the decoded TFCI values and the other one corresponding to the Reliability numbers associated with each decoded TFCI. The TFCI to be used to decode the TTI of data is found as follows:

TFCI=[$TFCI_1$, ..., $TFCI_N$], where N=TTI in ms/10
Reliability=[Reliability Measure$_1$, ..., Reliability Measure$_N$], where N=TTI in ms/10

1) Max_Reliability=maximum(Reliability Measure$_1$, ... Reliability Measure$_N$), where N=TTI in ms/10
   i=k, where Reliability Measure$_k$=Max_Reliability
   Final_Decoded_TFCI=$TFCI_i$ 2) Another approach could be to get the summed reliability measure for each distinct decoded TFCI hypothesis and choose the one with the highest total reliability measure. So in the vector TFCI:
   Choose the distinct TFCIs from the TFCI vector yielding:
   TFCI_distinct=[TFCI ... $TFCI_M$], where M is the number of distinct decoded TFCIs
   for j=1:M
   for k=1:N if TFCI(k)=TFCI_distinct(j)
Total_Reliability(j)=Total_Reliability(j)+Reliability(k)
end
end
end Max_Total_Reliability=maximum(Total_Reliability, . . . Total_Reliability$_M$), where M is the number of distinct decoded TFCIs;

i=k, where Total_Reliability$_k$=Max_Average_Reliability; and

Final_Decoded_TFCI=TFCI_distinct$_i$

Figure 7A:
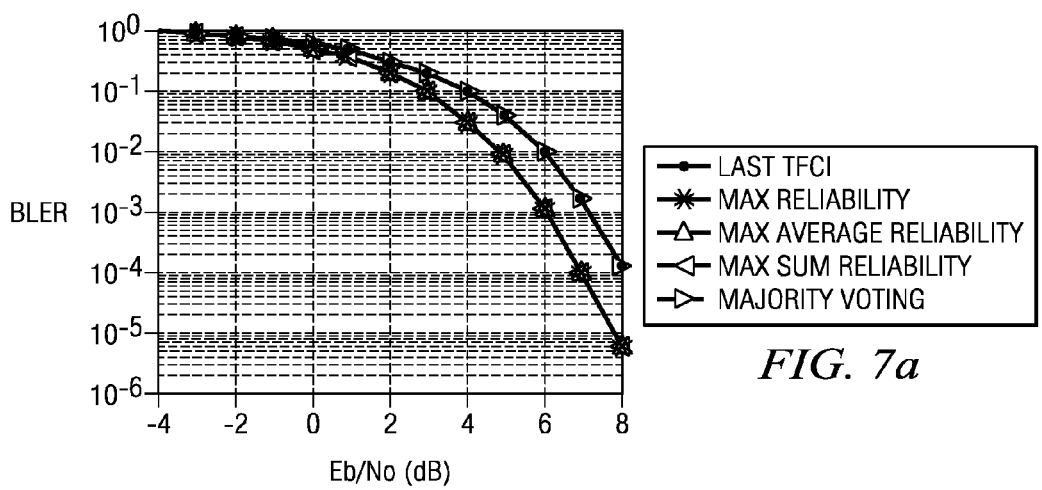
FIGS. 7a-7c show plots illustrating simulation results for TFCI decoding using various approaches for the reliability measure (20 ms, 40 ms and 80 ms respectively) in association with a method according to one embodiment of the present invention.
Figure 7B:
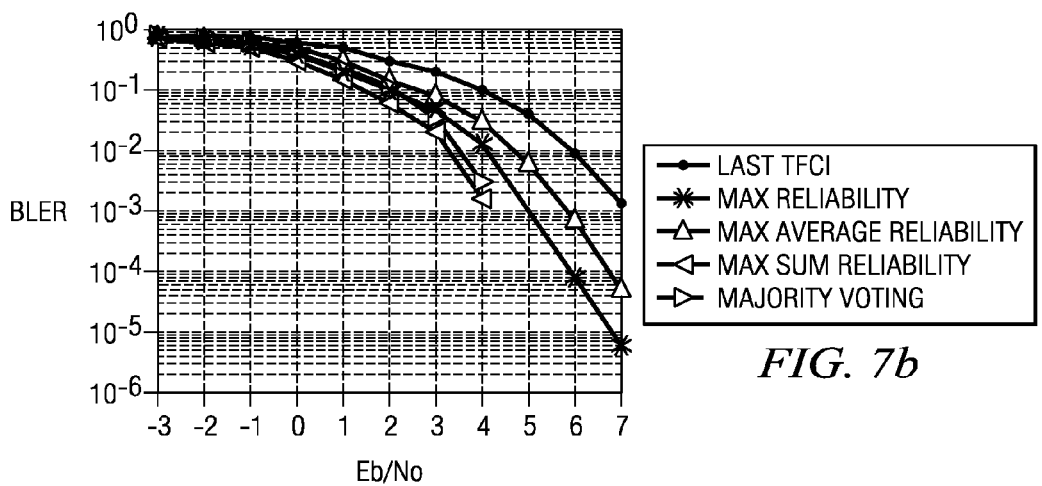
Figure 7C:
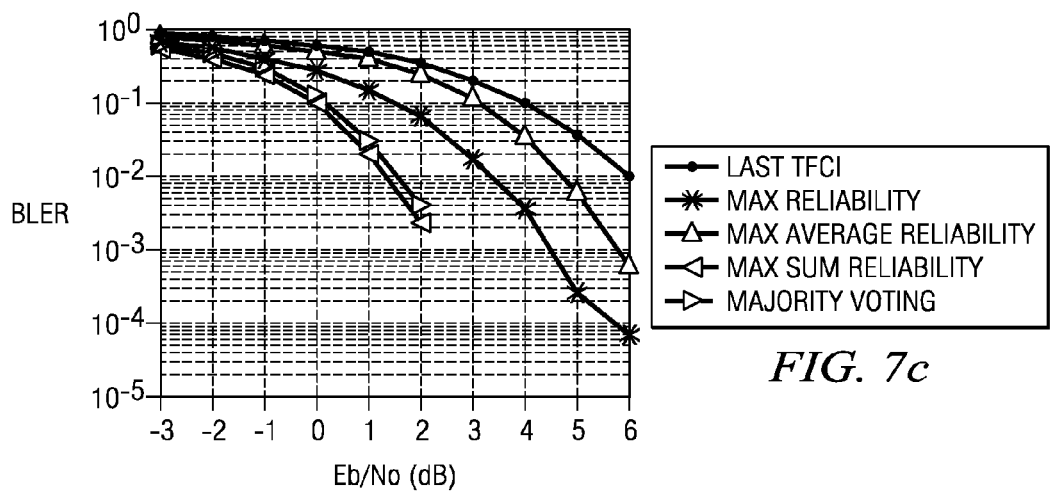

FIGS. 7a-7c show plots illustrating simulation results for TFCI decoding using various approaches for the reliability measure in association with a method according to one embodiment of the present invention. These simulation results are the results for various approaches to improve the TFCI decoding for TTIs that are longer than 10 ms. Looking at the results, it is obvious that the best solution for short and long TTIs is to use the maximum summed reliability for each distinct TFCI decoded.

When the code word space utilized is small, there can be significant power savings. The only hypotheses tested using decoder 100 were the ones known to exist, not all of them, as is the case for the Green Machine or other conventional decoders. As the number of hypotheses to be tested decreases, the power consumption scales down as well. The present inventors found this is not an infrequent case at all, and will be the norm rather then the exception. This point is illustrated by the fact that for an AMR call in 3 GPP, the TFCS size is 8. In such a case, the decoder 100 has to test for only 8 hypothesis instead of the possible 1024. Even in the case with a signaling channel in addition to the conversational channel and "Silence Indicator" (SID) and "no data", the TFCS size would be only 20.

TFCI Decoding in 3 GPP Release 5

Figure 8:
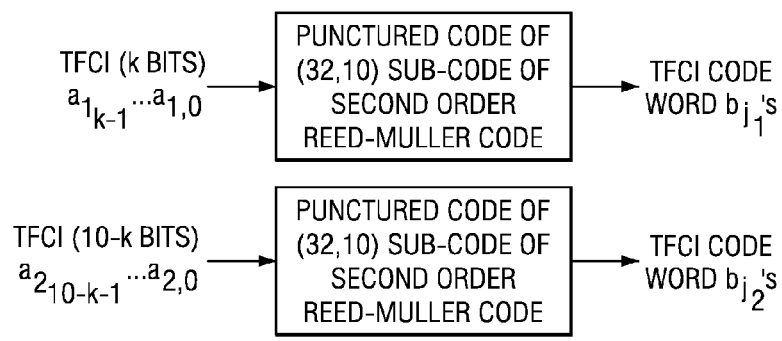
FIG. 8 illustrates a TFCI encoding procedure employed in 3 GPP Release-5, for flexible hard split mode.
Figure 9A:
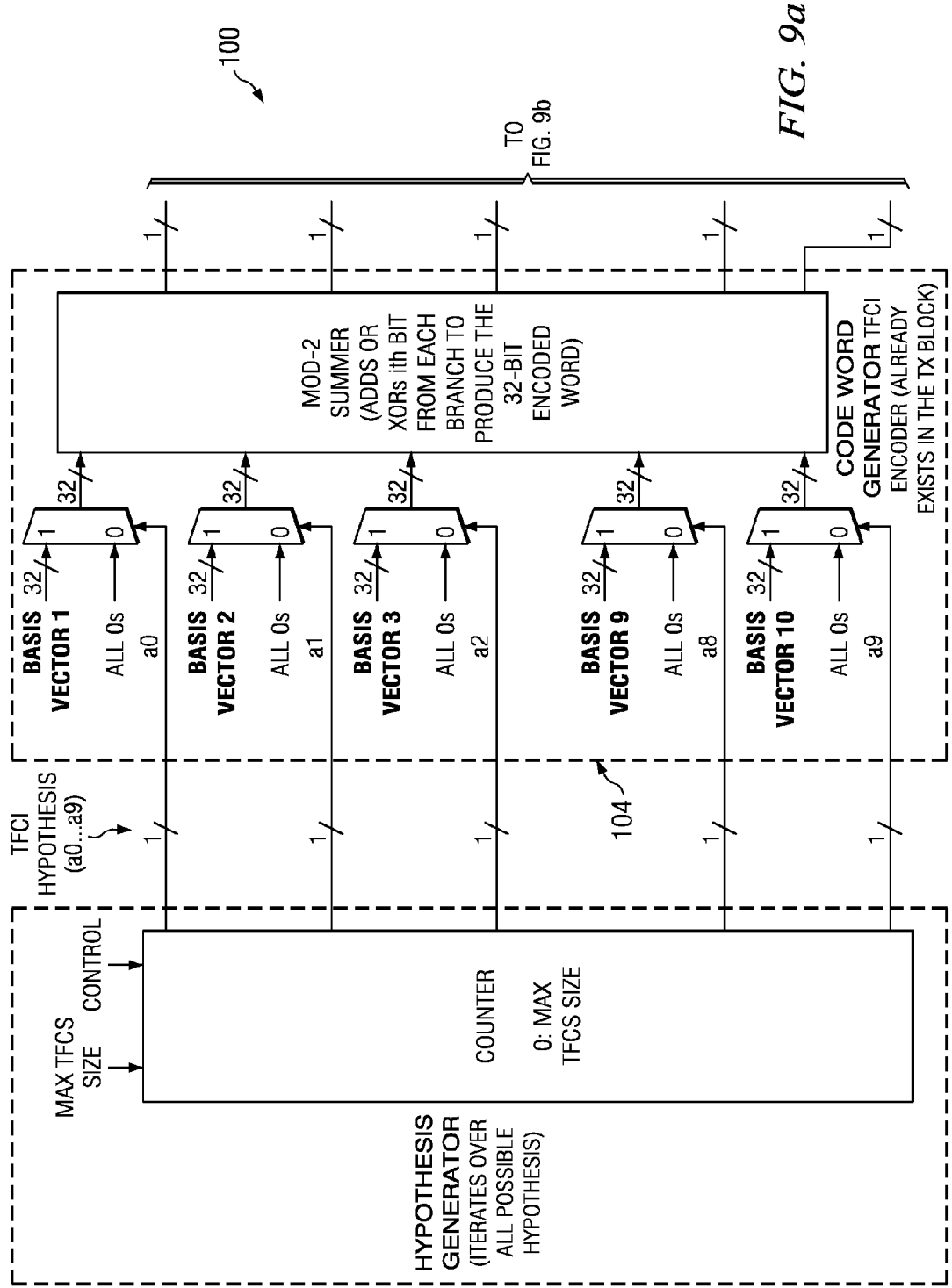
FIGS. 9a and 9b is a diagram illustrating a ML sparse decoder adapted to accommodate the Release-5 version of the 3GPP standard.
Figure 9B:
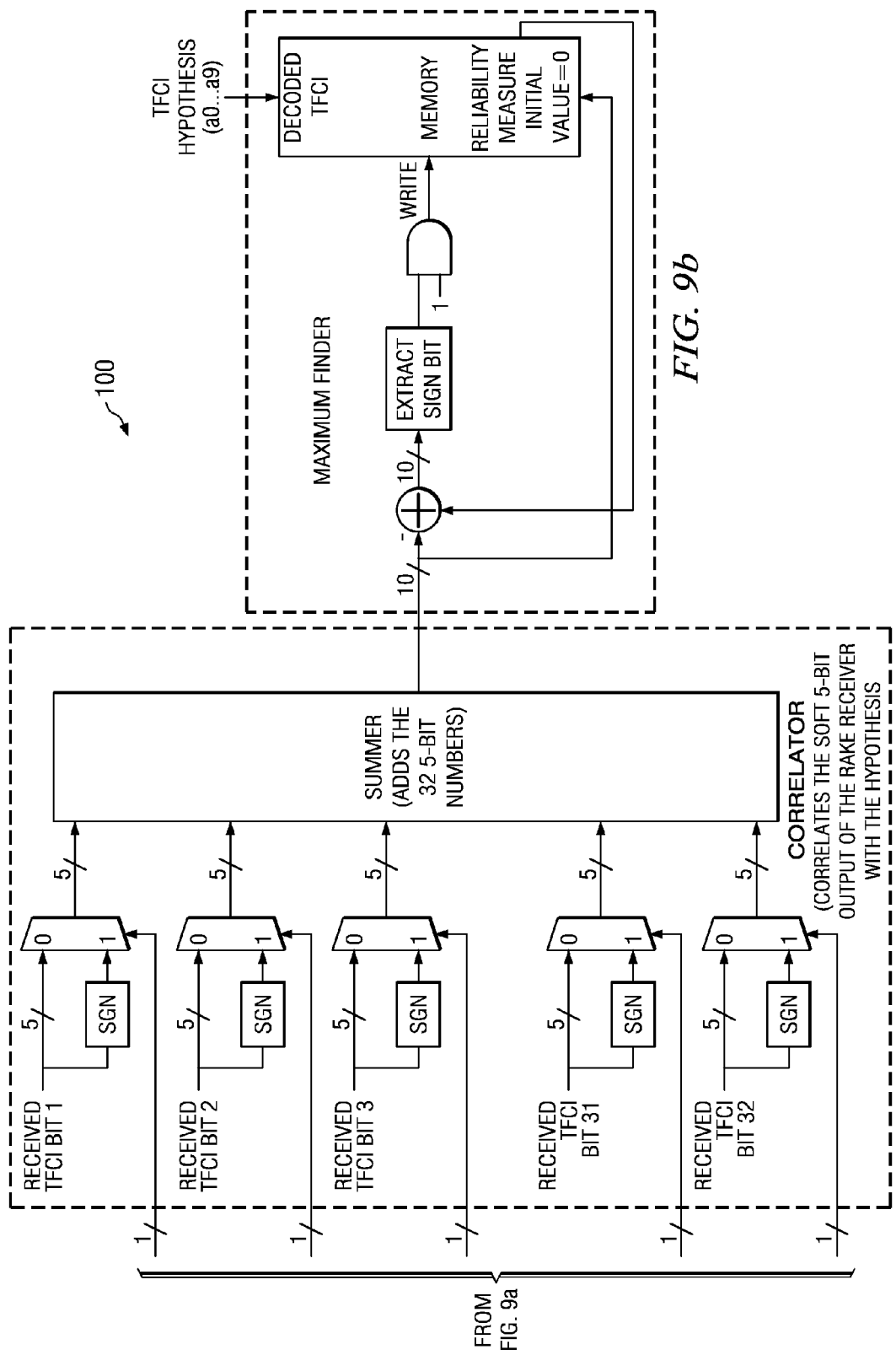

The sparse decoder 100 can be easily modified to be used with hard-split TFCI decoding described in the Release-5 version of the 3GPP standard. The sparse decoder 200 shown in FIGS. 9a and 9b can decode this flexible hard-split TFCI decoding in a single pass; whereas a conventional Green Machine has to run twice: one for DPCH with setting the received DSCH TFCI symbols to zero (puncturing) and a 5-bit TFCI for DSCH. In Release-5, this ratio may be different. FIG. 8 illustrates the TFCI encoding procedure used in Release-5 for flexible hard split mode; and as stated herein before, can be easily implemented with the structure of the sparse decoder 200 shown in FIGS. 9a and 9b described in greater detail herein below.

Based on the size of the punctured code used, a subset of the basis vectors is chosen from that used for the normal mode. This subset is used in the Code Word Generator 104; and the rest follows as described herein before. Those skilled in the art will readily appreciate that although some additional control may be required, no major structural changes are necessary.

The present invention is not so limited however, and although presented for a TFCI decoding problem, can be extended to other applications easily. This can be done in two ways. Firstly, in any application where the complete code word space is not used, we can improve the decoding ability. And secondly, we can design a longer block code than is needed to get significant coding gains. Obviously this improvement is at the expense of bandwidth.

Figure 10:
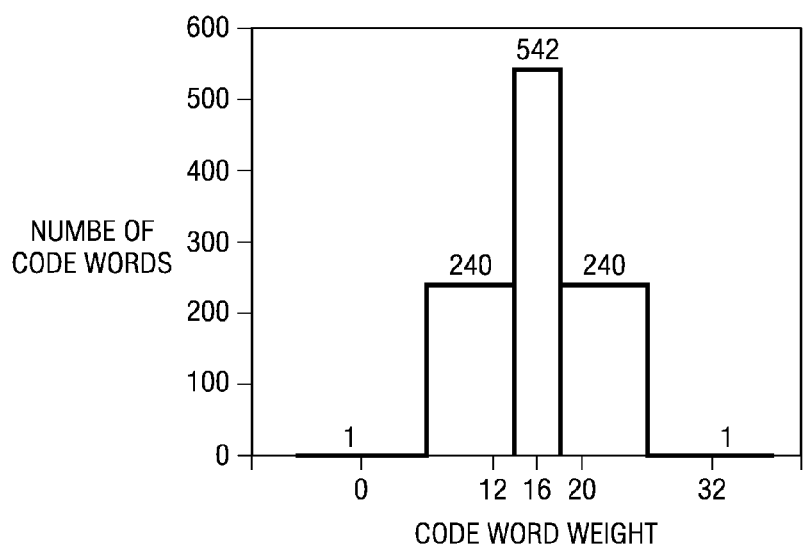
FIG. 10 is a graph illustrating the weight distribution for the (32, 10) Reed Muller code.

It has been shown that the average probability of a code word error is bounded as follows:

$$P_M \le \sum_{m=2}^{M} Q\sqrt{2\gamma_b R_c w_m},$$

where $\gamma_b$ is the SNR per bit, $R_c$ is the code rate and $w_m$ is the weight of the mth code word. It is clear that as M, the number of code words decreases and as $w_m$, the weight of those code word increases, the probability of a code word error decreases. FIG. 10 shows the weight distribution for the (32, 10) Reed Muller code.

Two strategies were disclosed for improving a code's performance: When designing a new code the capability of the decoder can be improved by 1) making the code sparse; and/or 2) choosing the codes by using a Hamming distance approach for all code words. So only choose those codes that have the highest hamming distance from other codes and that would give a very powerful code by virtue of choosing the code words that are as distinct as possible.

In view of the above, it can be seen the present invention presents a significant advancement in the art of error correction capability of block codes. Further, this invention has been described in considerable detail in order to provide those skilled in the decoder art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A maximum likelihood (ML) sparse decoder for block codes comprising:
   a hypothesis generator operational to iterate over all possible values of a predetermined transport format combination indicator (TFCI);
   a code word generator operational to generate a corresponding encoded TFCI for the hypothesis that is being decoded in a desired iteration;
   a correlator operational to correlate the corresponding encoded TFCI to the output of an associated rake receiver, the correlator comprising:
      a plurality of multiplexers, each multiplexer having a first input for receiving a corresponding bit of the received transport format combination indicator (TCFI) signal, a second input for receiving the sign of the corresponding bit of the received transport format combination indicator (TCFI) signal, and a control input for receiving a corresponding bit of the encoded TFCI generated by the code word generator, and
      a summer for adding the outputs of the multiplexers to generate a final correlation value; and
   a maximum finder operational to compare the final correlation value for the current iteration with that of the immediately previous iteration to determine the most correlated hypothesis.

* * * * *

UNITED STATES PATENT AND TRADEMARK OFFICE
CERTIFICATE OF CORRECTION

PATENT NO. : 7,600,179 B2 Page 1 of 1
APPLICATION NO. : 10/601384
DATED : October 6, 2009
INVENTOR(S) : Asghar et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1644 days.

Signed and Sealed this

Fifth Day of October, 2010

David J. Kappos
*Director of the United States Patent and Trademark Office*